US006351193B1

(12) United States Patent
Caceres Armendartz et al.

(10) Patent No.: US 6,351,193 B1
(45) Date of Patent: Feb. 26, 2002

(54) MICROWAVE EQUALIZER WITH INTERNAL AMPLITUDE CORRECTION

(75) Inventors: José Luis Caceres Armendartz; Silvia Delgado Cabello; Isidro Hidalgo Carpintero, all of Madrid (ES)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/468,346

(22) Filed: Dec. 21, 1999

(30) Foreign Application Priority Data

Dec. 28, 1998 (ES) .............................................. 9802694

(51) Int. Cl.[7] .............................. H01P 1/20; H03H 5/00
(52) U.S. Cl. ................... 333/28 R; 333/202; 333/219.1
(58) Field of Search .............................. 333/202, 219.1, 333/28 R, 28 T, 203

(56) References Cited

U.S. PATENT DOCUMENTS 4,216,448 A * 8/1980 Kasuga et al. .............. 333/203
4,692,723 A * 9/1987 Fiedziuszko et al. ....... 333/202
6,094,113 A * 7/2000 Wenzel et al. .............. 333/202

* cited by examiner

*Primary Examiner*—Robert Pascal
*Assistant Examiner*—Stephen E. Jones
(74) *Attorney, Agent, or Firm*—Sughrue Mion, PLLC

(57) ABSTRACT

Microwave equalizer with internal amplitude correction, preferably for application in satellite communications, comprising at least one resonant cavity (2), at least one incoming signal injector (6) that projects into said resonant cavity (2) for injecting signal into said resonant cavity (2), and at least a first resistive tuner (5). The position of said first tuner (5) with respect to said injector (6) produces electromagnetic coupling between both tuner (5) and injector (6), giving rise to an amplitude attenuation effect in said signal. A variation in said relative position between said means the first resistive tuner and injector permits changing said attenuation in a selective manner. A second resistive tuner (7) can be used in combination with the first resistive tuner (5) to optimize the response of the equalizer.

9 Claims, 8 Drawing Sheets

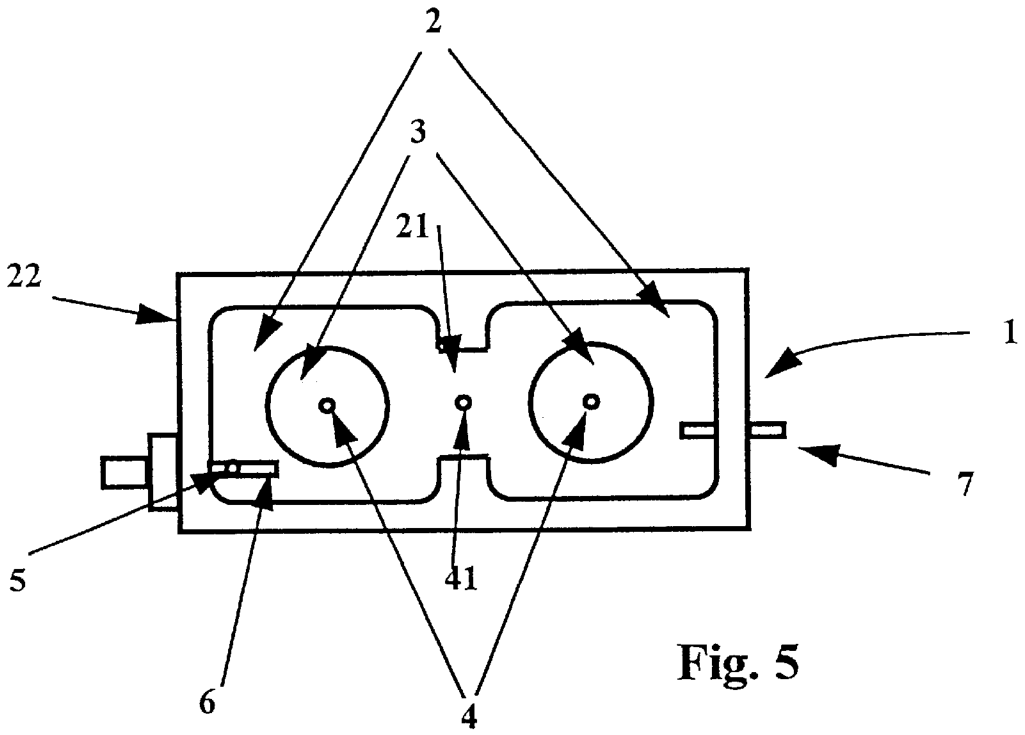
Fig. 5
Fig. 6
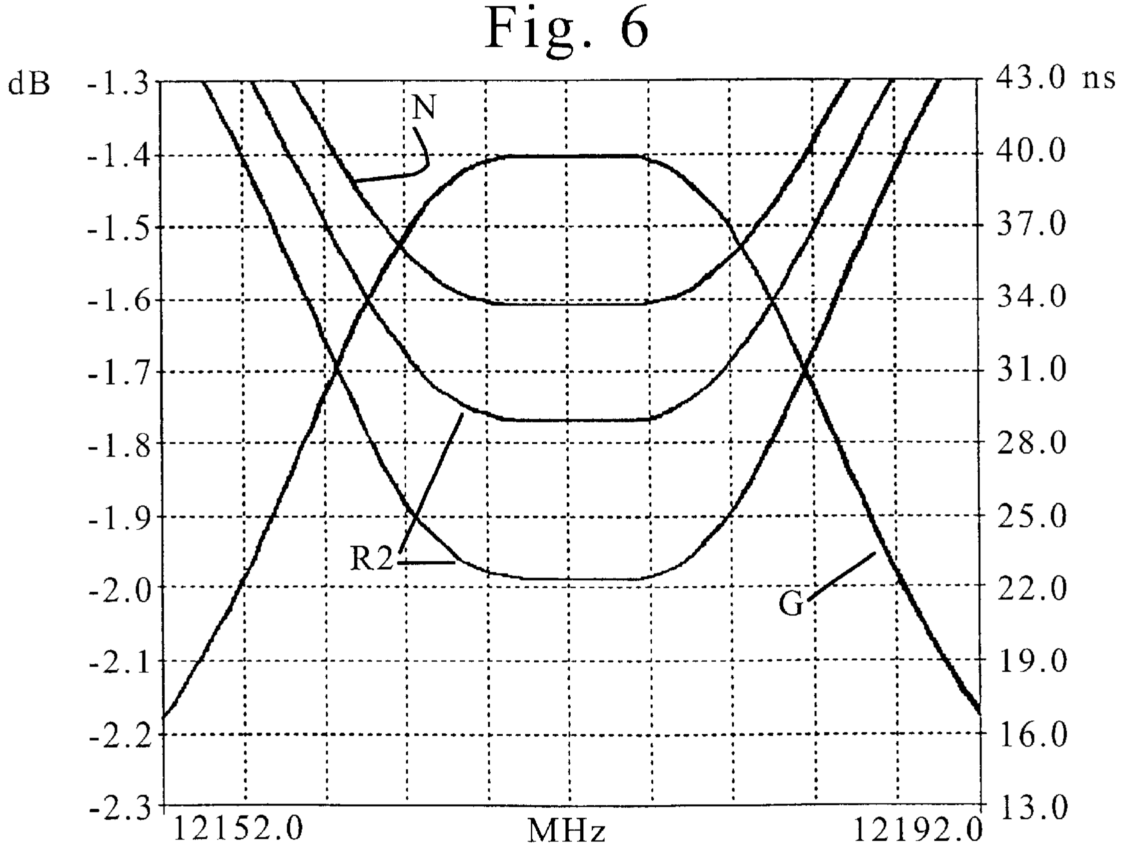

MICROWAVE EQUALIZER WITH INTERNAL AMPLITUDE CORRECTION

The present invention relates to a microwave equaliser with internal amplitude correction, preferably for application in satellite communications. More specifically, the invention relates to a microwave equaliser comprising resonant cavities, operating in a reflexive configuration, and having tuning means to achieve equalising of the distortions that can arise during the transmission of a signal, in both group delay and in amplitude. The present invention is particularly useful for applications which require very precise, high quality equalisation, in both group delay and in amplitude, as for example in the case of channel filters normally employed in satellite communications payloads.

BACKGROUND OF THE INVENTION

In practice, conventional equalisers designed to perform both delay and amplitude equalisation have the drawback that both the equaliser itself and the device for coupling the latter to a main filter, for example a circulator, behave in a non-ideal manner, for which reason simultaneous equalisation of the two parameters cannot be achieved; or at best the simultaneous equalisation so obtained is of a quality and accuracy significantly less than that desired.

A conventional type solution to this problem is to employ additional equalisation means corresponding to each type of equalisation that permits an independent control for group delay and for amplitude, respectively. In this sense, in current practice, the choice has been to add an independent amplitude equaliser to the delay equaliser. In certain cases, this solution can consist in the use of a variable, resistive means the setting of which affects the amplitude of the signal to be equalised. However, this solution implies, in turn, a significant economic impact as well as additional weight to be borne due to the mass of said additional equaliser. This effect is a drawback of considerable magnitude, particularly in the case of satellite communications.

The use of a variable, resistive means to perform delay and amplitude equalisation is known through the patent U.S. Pat. No. 4,524,337, incorporated in the present specification by reference. This document proposes an equaliser which comprises a 90° hybrid matrix formed by a toroidal transformer, a reactive network to shift the phase of a signal applied to said matrix that permits group delay correction and consists of a pair of capacitors each of which being connected to a variable inductor; and an RC network to provide amplitude correction to the signal at the matrix output. The RC network, in turn, comprises three resistors, one of which is a variable resistor connected across two connection points of the transformer such that one connection point constitutes the input and the other connection point is the equaliser output. The setting of said variable resistor permits the amplitude response to be varied. In this way, it is intended to achieve a correction in the amplitude that is essentially independent of the delay adjustment, which is achieved via the pertinent delay correcting circuitry.

As may be appreciated, the equaliser described in patent U.S. Pat. No. 4,524,337 requires a relatively high number of components, i.e. a toroidal transformer, several capacitors, resistors and inductors that inevitably give rise to an increase in the cost and complexity of the circuit.

Moreover, an equaliser of this type is not generally suitable for equalising high frequency signals, as is the case of the equaliser of the present invention.

As a result, there exists a need for a high frequency equaliser capable of correcting group delay and amplitude independently of each other, i.e. the correction of one type of distortion does not negatively affect the correction of the other distortion, such that the economic cost and the complexity of the circuitry required are reduced substantially.

DESCRIPTION OF THE INVENTION

To overcome the problems outlined above, the equaliser with internal amplitude correction object of the present invention is proposed, which comprises resonant cavities of conventional type and works in a reflexive configuration. In said equaliser use is made of a variable, resistive tuning means, preferably a resistive screw, which in a coupling arrangement with an input signal injection means that projects into a cavity of the equaliser, produces the effect of selectively introducing losses in certain segments of the frequency band, said effect being variable both in magnitude and in the segment of the band affected, depending on the position of said resistive screw with respect to said input signal injection means.

More specifically, the equaliser of the present invention is characterised in that it comprises at least one input signal injection means that projects into said resonant cavity for injecting signal into said resonant cavity, and at least a first resistive tuning means for absorbing electromagnetic energy through coupling with respect to said input signal injection means, in such a manner that at least one relative position between said first resistive tuning means and said input signal injection means is variable for producing selectively an amplitude attenuation effect in said signal.

According to a preferred embodiment of the invention, at least a first resistive tuning means effects a first change of position in the direction of a plane substantially perpendicular to an input signal injection means in order to produce a variation in one parameter of a frequency response of the equaliser.

According to other preferred embodiment of the invention, at least a first resistive tuning means effects a second change of position in the direction of a plane substantially parallel to an input signal injection means in order to determine the degree of symmetry between respective ends of the response in the equaliser frequency band.

According to another preferred embodiment of the invention, the equaliser comprises at least a first resistive tuning means that is mounted adjacent to at least a third tuning means, each being displaceable in independent form and capable of producing said first and/or said second change of position in a selective manner.

According to another preferred embodiment of the invention, the equaliser comprises also a second resistive tuning means housed in a cavity of the equaliser for producing losses in a frequency band of the signal in a symmetrical manner.

According to another preferred embodiment of the invention, the first and second resistive tuning means are screws that include material capable of absorbing electromagnetic energy.

According to another preferred embodiment of the invention, the input signal injection means is a signal input probe.

In addition, a further object of the invention is to provide a microwave filter incorporating the equaliser described above.

Another object of the invention is to provide a microwave filter that employs, additionally, the second resistive tuning means described above.

These and other advantageous features of the invention can be understood in greater detail in the embodiment examples that are described below with the assistance of the attached figures.

BRIEF DESCRIPTION OF THE FIGURES

FIG. 5 is a plan view of a schematic and alternative representation of the equaliser of the present invention including a second resistive tuning means.

FIG. 6 is a graphical and simulated representation in amplitude coordinates of the modulus of the reflection factor vs. frequency of the equalising effect produced by the second resistive:tuning means of FIG. 5.

EXAMPLES OF PREFERRED EMBODIMENTS

Figure 1:
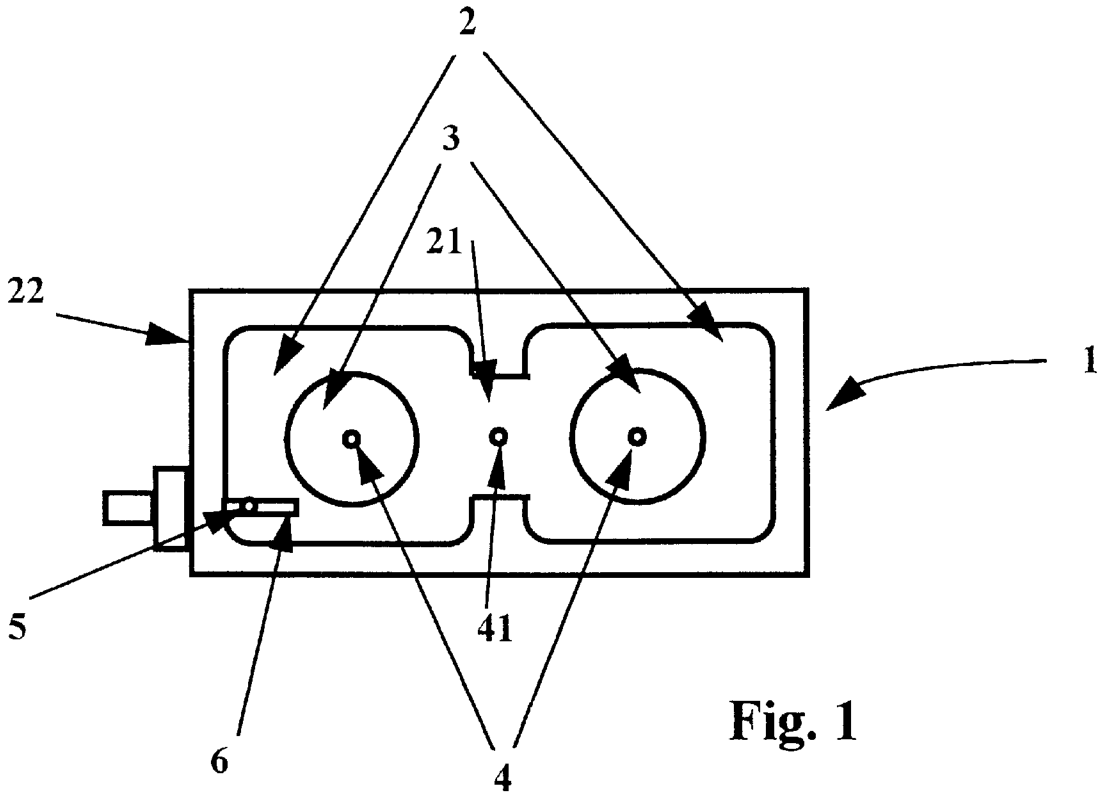
FIG. 1 is a plan view of a schematic representation of the equaliser of the present invention including a first resistive tuning means.
Figure 2:
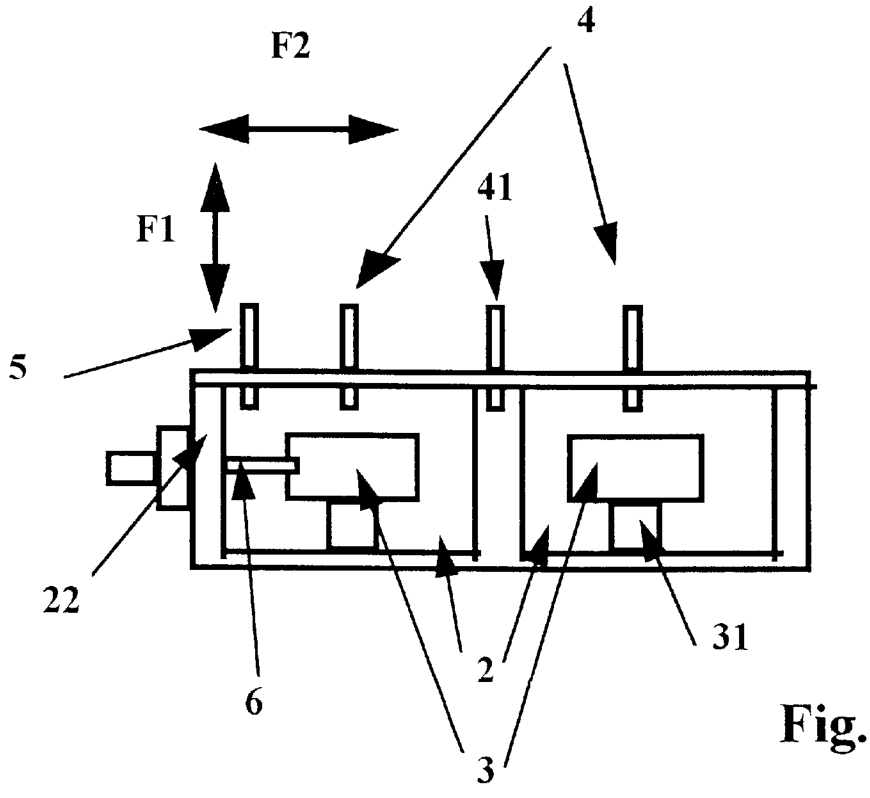
FIG. 2 is a side view of the equaliser of FIG. 1.

FIGS. 1 and 2 show a preferred embodiment of the microwave equaliser proposed in the present invention, in which it can be seen a casing (1) of the equaliser, the lid covering said casing (1) being excluded from the FIG. 1 for reasons of simplicity and clarity. Nevertheless, in the same figure, the position of a series of tuning means the description of which is provided below and which are preferably mounted on said lid are indicated. Said lid and the respective position of said tuning means can be observed, however, in FIG. 2.

Thus, the equaliser of the invention comprises a plurality of resonant cavities (2) in which, preferably, dielectric resonators (3) mounted on resonator stands (31) are to be found. Over each dielectric resonator is a tuning means (4), for example conventional tuning screws, in order to permit in conventional manner, adjustments of the frequency of the received signal for correcting a possible distortion in the group delay suffered by said signal.

Optionally, there can be, between two adjacent cavities (2) of the equaliser, a coupling orifice (21) that, as is known in this field of the art, serves to optimise the coupling between the respective resonators (3) of each of the adjacent cavities (2). In this case it is also possible to make use of a tuning means (41) in said orifice (21), for example a tuning screw.

The equaliser of the invention also comprises at least one input signal injection means (6), for example an input probe that projects into a first cavity (2) of the equaliser and that serves to inject the input signal into said first cavity (2). In the preferred embodiment of the present invention, said probe (6) takes the form of a thin, normally metallic body mounted on a wall (22) of the cavity (2) projecting into said cavity as a prolongation of the inside conductor of a coaxial transmission medium, as can be appreciated from the figures.

Likewise, the equaliser of the invention comprises a variable, resistive tuning means (5), such as for example a resistive screw, which serves to provide amplitude equalisation in the received signal. Said resistive tuning means (5) is arranged in such a way that its position with respect to the probe (6) produces a coupling effect. Consequently, by varying the position of the resistive tuning means (5), both in the direction of a vertical plane with respect to the probe (6) and in the direction of a parallel plane with respect to said probe, a variation is produced in the resulting coupling between the resistive tuning means (5) and the signal injection means (6) giving rise, therefore, to adjustments in the amplitude of the received signal.

Said screw or resistive tuning means (5) includes material capable of absorbing electromagnetic energy for performing the absorption functions described herein.

Consequently, the adjustment in the resistive tuning means (5) permits a selective attenuation in the signal to be obtained that serves to equalise the distortions produced in the signal amplitude.

Figure 3:
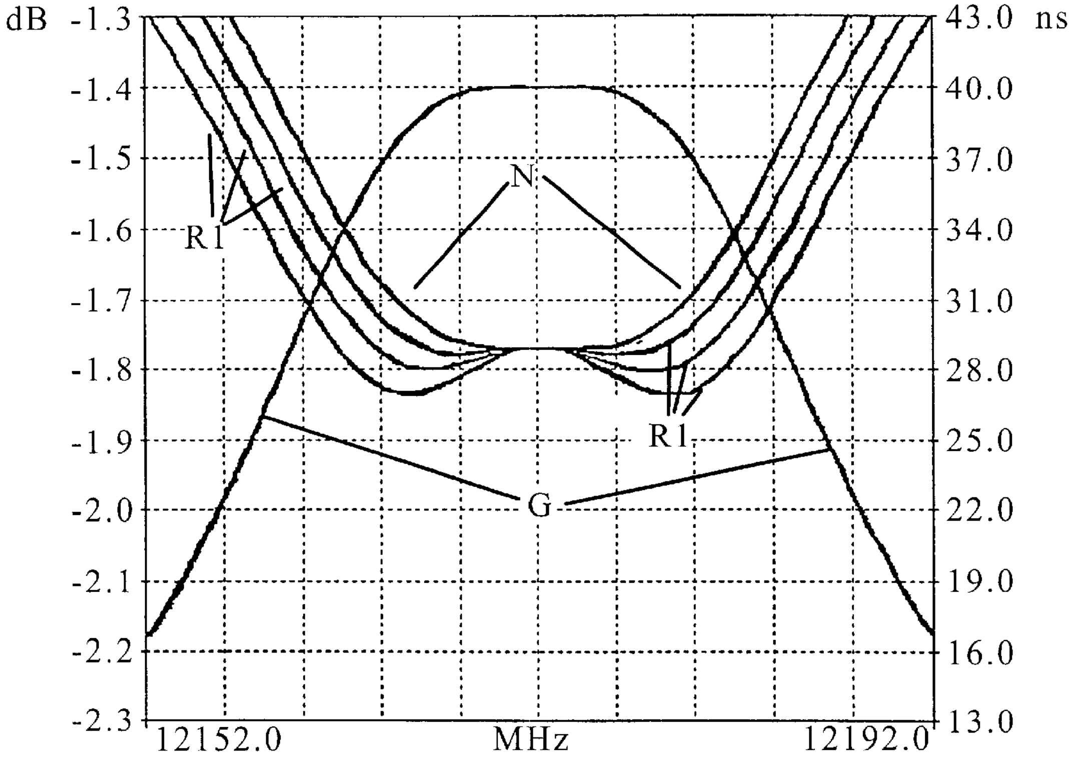
FIG. 3 is a graphical and simulated representation in amplitude coordinates of the modulus of the reflection factor vs. frequency of the equalising effect produced by the first resistive tuning means of FIG. 1.

FIG. 3 is a simulated representation of the equalisation effect that the resistive tuning means (5) of FIG. 1 produces, in which said resistive tuning means (5) is a resistive screw. In said figure, a representation may be observed of the group delay (G), and a curve (N) that represents the nominal response of the equaliser in amplitude coordinates of the modulus of the reflection factor vs. frequency, and that is produced without taking into account the effect of the resistive screw. Likewise, various curves may be observed that are identified in the figure by the reference numeral (R1), which represent the responses of the equaliser with the effect of said resistive screw included, such that each curve (R1) corresponds to a different position of the resistive tuning means (5) with respect to the signal injection means (6). The horizontal axis of the figure gives values of the frequency in MHz, while the vertical axes are in dB on the left-hand side and in ns on the right-hand side. This simulation corresponds to an electrical len known as (θ), equal to zero, in accordance with the equivalent circuit of FIG. 7 (which shall be described in detail further below), where θ represents the relative position between the resistive screw and the input probe according to the direction termed F2 in FIG. 2.

Consequently, it can be appreciated that the resistive screw of the equaliser of FIG. 1 produces an attenuation effect in which the ends of said frequency band experience greater attenuation in comparison with the central part of said frequency band. The frequency response so obtained is that which serves to achieve the amplitude equalisation of the signal.

It is to be pointed out, however, that the resistive tuning means (5) can change position in two directions whereby a first change in position is in the direction of a plane substantially perpendicular with respect to the input signal injection means (6), for example by turning the resistive screw to bring it closer to the probe; and a second change in position is in the direction of a plane substantially parallel with respect to the input signal injection means (6).

Said first and second changes in position are illustrated in FIG. 2 by means of the arrows (F1) and (F2), respectively.

The first change in position permits adjustment of the response of the equaliser with regard to the magnitude of the resistive effect on the frequency response of the equaliser.

On the other hand, the position of the resistive tuning means (5) in a plane substantially parallel with respect to the input signal injection means (6) determines the degree of symmetry between the ends of the response curve in the aforementioned frequency band. As a result, the second change in position mentioned permits adjustments to be made in the magnitude of the asymmetry of the equaliser response in the frequency band.

In practice, once the position of the resistive tuning means (5) has been determined in the plane which the arrow (F2) defines, it is possible to opt for fixing said tuning means (5) in said position, or for providing a mechanism to permit its selective displacement in the direction of the arrow (F1).

It is also to be mentioned that both the first change in position in the direction of the arrow (F1), and the second change in position in the direction of the arrow (F2) can correspond to relative displacements. That is, the displacements in the direction of either of the arrows (F1) or (F2) can consist either in the movement of the resistive tuning means (5) towards the input signal injection means (6), or else in the movement of the input signal injection means (6) towards the resistive tuning means (5).

Figure 4:
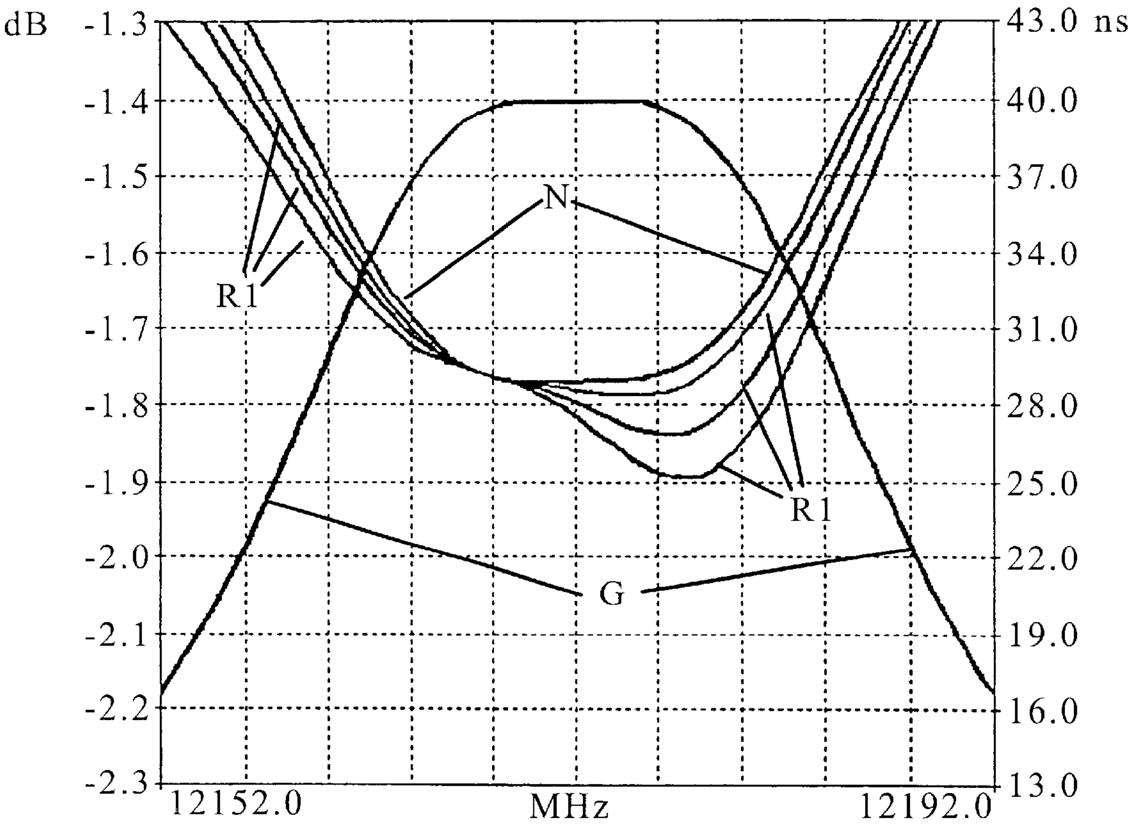
FIG. 4 is a graphical and simulated representation in amplitude coordinates of the modulus of the reflection factor vs. frequency of another equalising effect produced by the first resistive tuning means of FIG. 1.

Shown in FIG. 4 is an alternative representation of the curves of FIG. 3, in which the curve (N) is maintained in identical form to that of FIG. 3. However, it can be clearly seen that the curves (R1) have taken on an asymmetric form in the frequency band, the shape of which is determined by the aforementioned second change in position of the resistive tuning means (5). This simulation corresponds to an electrical length (θ), other than zero.

With reference now to FIG. 5, an alternative embodiment of the equaliser of the invention can be appreciated in which the parts and components similar to those of FIG. 1 have the same reference numerals.

In said figure, an equaliser similar to that of FIG. 1 can be observed with the exception that the equaliser of this figure comprises additionally a second resistive tuning means (7) that can be, for example, a second resistive screw.

Said second resistive tuning means (7) is preferably coupled to a second cavity of the equaliser, the effect of which is to degrade the quality factor of the equaliser, generally known as the Q factor.

The effect produced by this second resistive tuning means (7) is to increase the loss in a symmetrical and more pronounced manner in the centre of the frequency band. This behaviour can be explained with the aid of FIG. 6. In said figure, in a manner analogous to that of FIGS. 3 and 4, a simulated and approximate representation of the equalisation effect that is produced by the second resistive tuning means (7) of FIG. 5 is shown, in which said resistive tuning means (7) is also a resistive screw. In this figure, there can also be observed a curve (N) which represents the nominal response of the equaliser in amplitude coordinates of the modulus of the reflection factor vs. frequency, and which is produced without taking into account the effect of any resistive screw. Likewise, several curves with reference (R2) can be seen, which represent the response of the equaliser with the effect of the second resistive screw included.

As may be appreciated from said figure, the attenuation produced in the frequency band takes a form that is substantially symmetric and is more pronounced in the centre of said frequency band.

This effect produced by the second resistive tuning means (7) can be used advantageously for obtaining a combined effect between both resistive tuning means (5) and (7) for providing greater flexibility in the response of the equaliser. Thus, as is shown in FIG. 5, the equaliser proposed by the present invention can comprise a first resistive tuning means (5) and a second resistive tuning means (7). Consequently, while the second resistive tuning means (7) produces an increased loss in a symmetric fashion (FIG. 6) and more pronounced in the centre of the frequency band, the first resistive tuning means (5), however, has the opposite effect, i.e. it introduces greater loss at the ends of the frequency band, the effect of which can be symmetric (FIG. 3) or asymmetric (FIG. 4), said combination giving rise to an amplitude equalisation with improved response.

Figure 7:
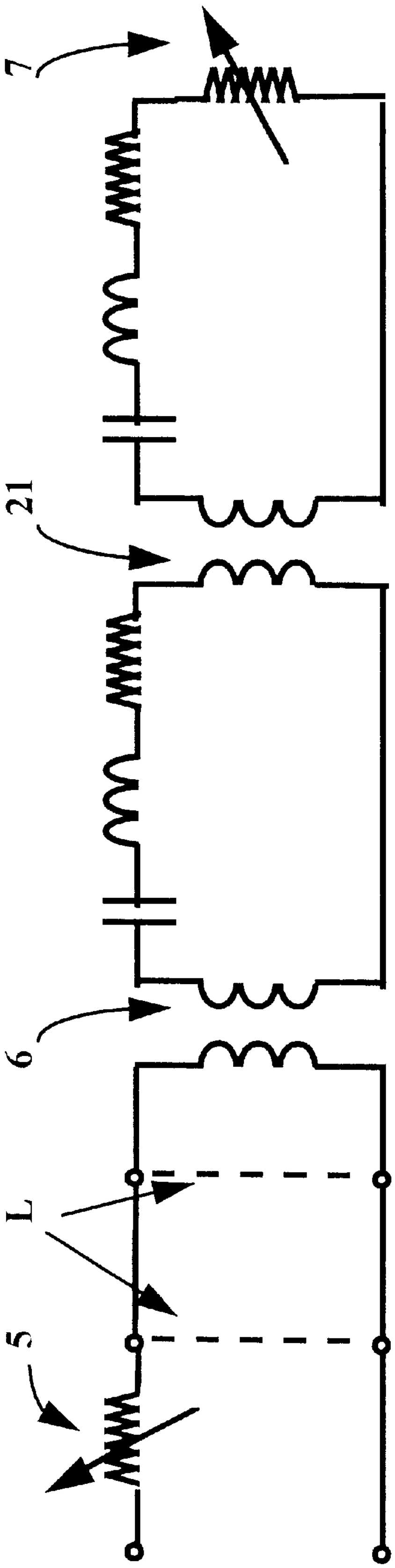
FIG. 7 is a diagram of an equivalent circuit of the equaliser of FIG. 5.

FIG. 7 shows an equivalent circuit of the equaliser of FIG. 5. In this circuit, the first resistive tuning means (5) is modelled as a resistance in series at the input to the equaliser and separated by an electrical length from the input coupling, whilst the second resistive tuning means (7) is modelled as a resistance inside the resonant circuit (consequently, it degrades the Q factor). This circuit reproduces the same qualitative behaviour as is found in practice. Thus, the circuit of FIG. 7 shows a coupling point represented by the reference number (6) since it is the equivalent of the coupling produced by the signal injection means (6) in FIG. 5. Likewise, another coupling point shown in FIG. 7 by the reference numeral (21) is the equivalent of the orifice (21) between two adjacent cavities in FIG. 5. The broken lines (L) in the figure represent an electrical length (θ), which models the position of the first resistive tuning means (5) in the direction parallel to the input signal injection means (6), i.e. in the direction of the arrow (F2) in FIG. 2.

Figure 8:
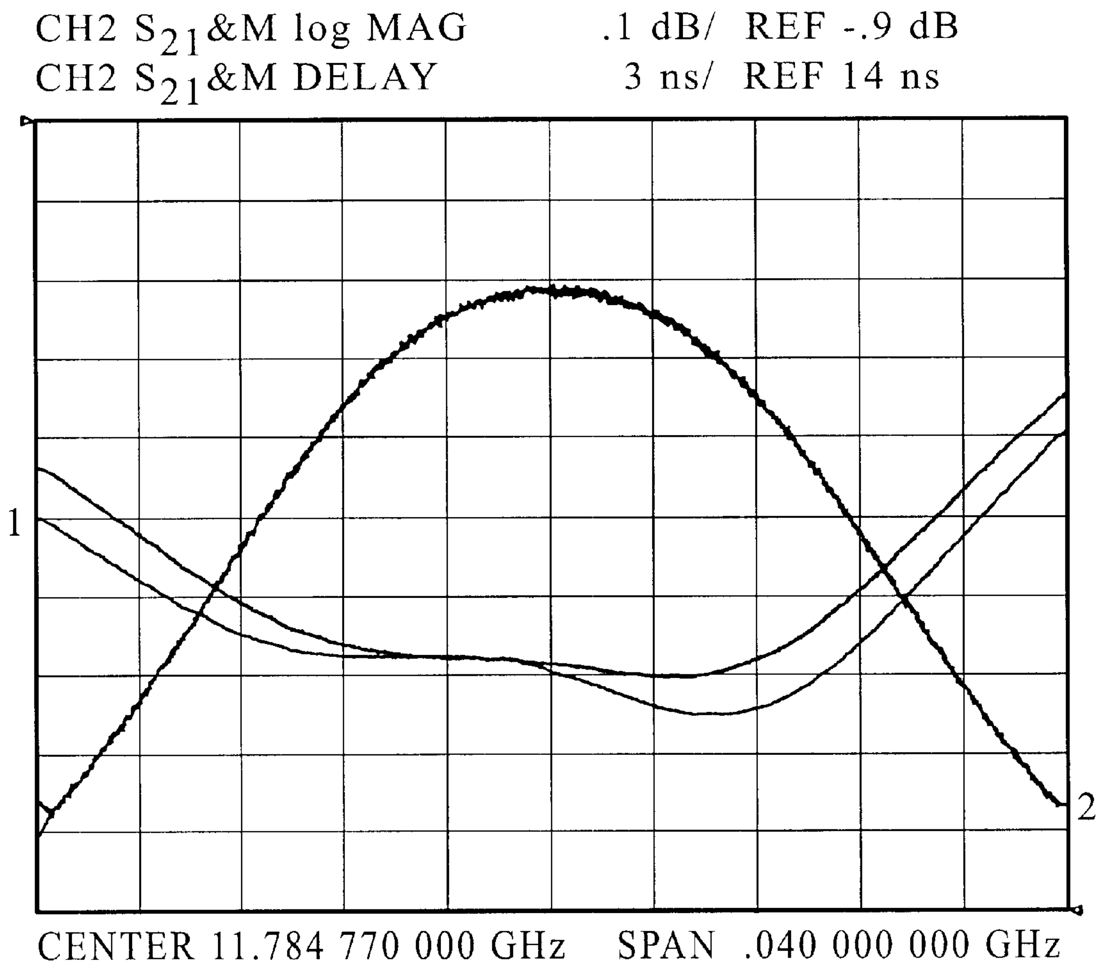
FIG. 8 is a graphical representation in amplitude coordinates of the modulus of the transmission coefficient vs. frequency, based on experimentally obtained results of the equalising effect produced by the first resistive tuning means of FIG. 1.

In FIG. 8 there can be observed a graphical representation in amplitude coordinates of the modulus of the transmission coefficient vs. frequency, based on results obtained experimentally of the equalisation effect produced by the first resistive tuning means (5) of FIG. 1.

The horizontal axis of this figure represents the frequency range. In the heading of the figure the parameters and scales represented on the vertical axis are given. The figure shows the group delay in a similar manner to that of FIGS. 3, 4 and 6; and the return loss represented by two curves that correspond to responses with and without the resistive screw effect.

Figure 9:
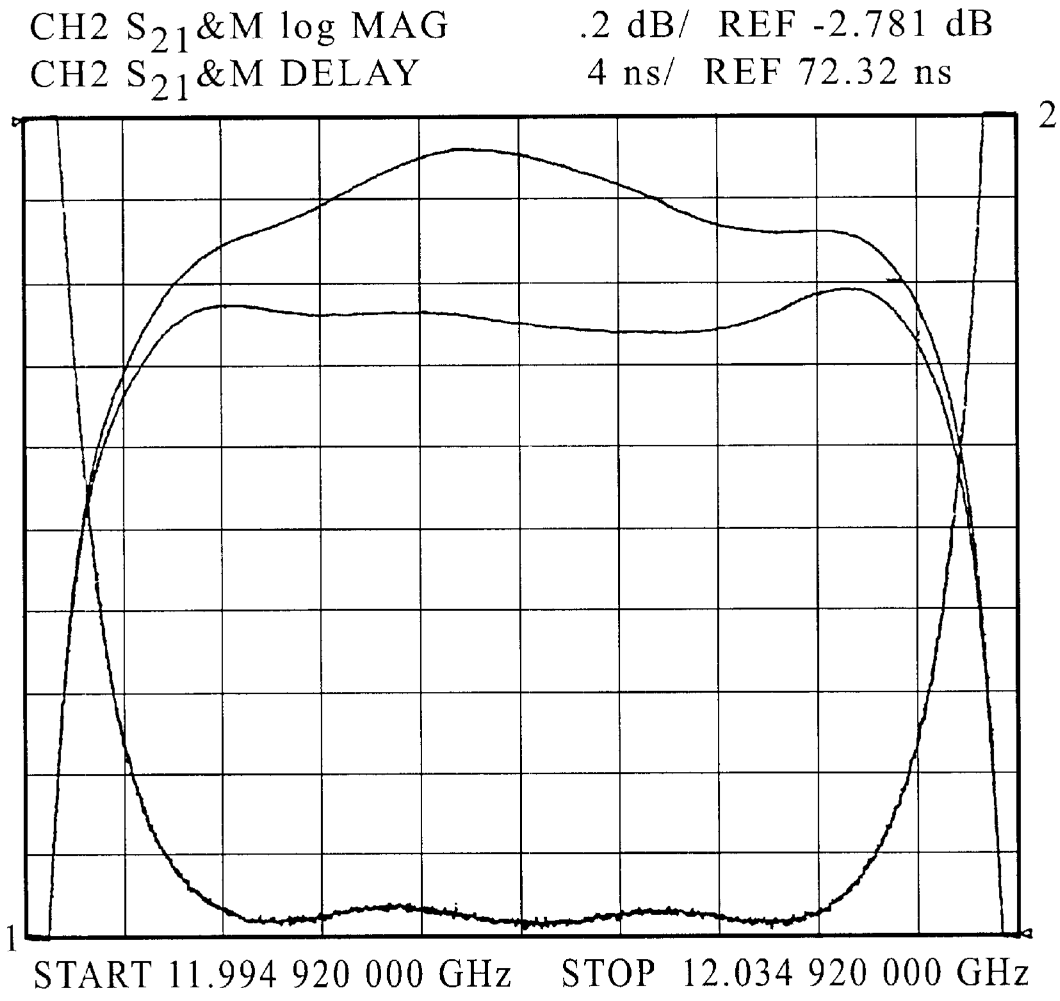
FIG. 9 is a graphical representation in amplitude coordinates of the modulus of the transmission coefficient vs. frequency, based on experimentally obtained results of the response of a filter using the equalising effect produced by the combination of the first and second resistive tuning means.

Likewise, FIG. 9 is a graphical representation in amplitude coordinates of the modulus of the transmission coefficient vs. frequency, based on results obtained experimentally on the response of a filter equalised externally making use of the equalisation effect produced by the combination of the first and second resistive tuning means, both being, in this case, resistive screws.

Thus, in this figure one curve of group delay and two curves that represent the equalisation with and without the effect of the resistive screws may be observed.

Figure 10:
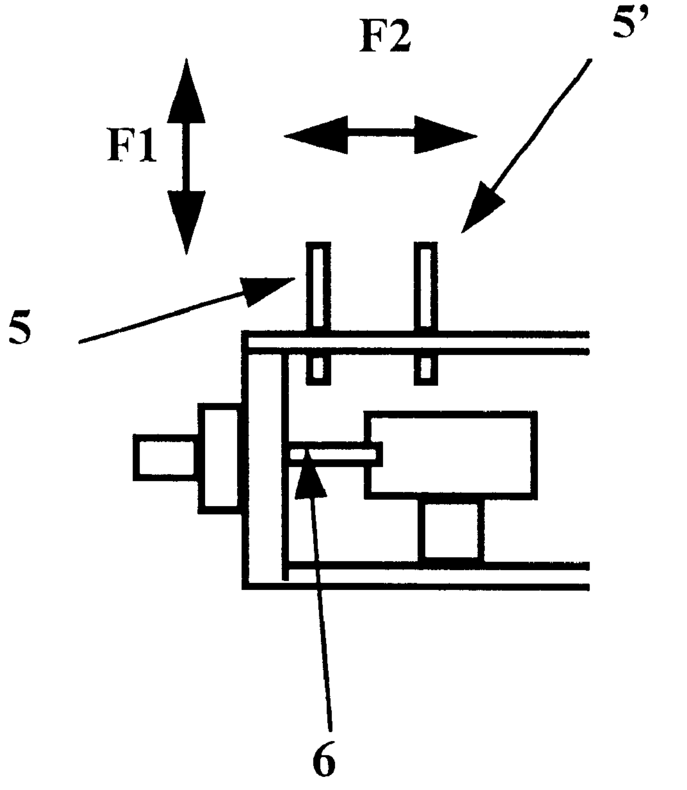
FIG. 10 is a partial detail drawing of the equaliser of the invention according to an alternative embodiment in which use is made of two resistive tuning means one adjacent to the other.

Optionally, the equaliser of the invention can make use of two tuning means (5) and (5') mounted one (5) adjacent to the other (5') as can be seen in the detail of FIG. 10, each one being selectively displaceable independently of the other in order to perform the first and second changes in position described above in a selective manner. With this arrangement it is possible to obtain various combinations in the respective position of each resistive tuning means (5) and (5') both in the direction of the arrow (F1) and in the direction of the arrow (F2), said combination making possible adjustments in accordance with the equalisation requirements to be implemented.

Therefore, according to the equaliser of the invention, in any of its alternative embodiments, equalisations of group delay and amplitude, being mutually independent, are achieved with a very reduced number of additional components, thereby favouring a reduction in manufacturing costs and weight loading, important factors in the design of equalisers of this type.

Finally, it is to be noted that although the equaliser and the corresponding filter of the invention are preferably for microwave applications, they can be used equally in applications that generally require high frequency signal equalisation.

What is claimed is:

1. Equaliser of high frequency electromagnetic signals that comprise microwaves, with internal amplitude correction, said equaliser comprising at least one resonant cavity, characterised in that said equaliser also comprises at least one input signal injection means that projects into said at least one resonant cavity for injecting said signal into said at least one resonant cavity, and at least a first resistive tuning means for absorbing electromagnetic energy by coupling with respect to said input signal injection means so that at least one relative position between said at least a first resistive tuning means and said at least one input signal injection means is variable in order to produce in a frequency selective manner, an amplitude attenuation effect by energy absorption in said signal.

2. Equaliser according to claim 1, characterised in that said at least a first resistive tuning means is adapted to perform a first change in position in the direction of a plane substantially perpendicular with respect to said input signal injection means for producing a variation in one parameter of a frequency response of the equaliser.

3. Equaliser according to claim 1, characterised in that said at least a first resistive tuning means is adapted to perform a second change in position in the direction of a plane substantially parallel with respect to said input signal injection means for determining a degree of symmetry between respective ends of a frequency response of the equaliser.

4. Equaliser according claim 1, characterised in that it also comprises a second resistive tuning means (7) housed in a cavity of the equaliser for producing loss in a frequency band of the signal in a symmetrical manner.

5. Equaliser according to claim 4, characterised in that the first and the second resistive tuning means ((5) and (7)) are screws that incorporate material capable of absorbing electromagnetic energy.

6. Equaliser according to claim 5, characterized in that said at least a first resistive tuning means is adapted to perform a second change in position in the direction of a plane substantially parallel with respect to said input signal injection means for determining a degree of symmetry between respective ends of a frequency response of the equaliser, and further characterised in that said at least first resistive tuning means is mounted adjacent to at least a third tuning means, each being displaceable in an independent manner and capable of producing at least one of said first and said second changes in position in a selective manner.

7. Equaliser according to claim 1, characterised in that the input signal injection means (6) is a signal input probe.

8. Microwave filter using the equaliser of claim 1.

9. Microwave filter according to claim 8, characterised in that said equaliser further includes a second resistive tuning means (7) housed in a cavity of the equaliser for producing a loss in a frequency band of the signal in a symmetrical manner.

* * * * *